(12) United States Patent
Takeuchi

(10) Patent No.: US 6,534,846 B1
(45) Date of Patent: Mar. 18, 2003

(54) LEAD FRAME FOR SEMICONDUCTOR DEVICE AND SEMICONDUCTOR DEVICE USING SAME

(75) Inventor: Yukiharu Takeuchi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/435,643

(22) Filed: Nov. 9, 1999

(30) Foreign Application Priority Data

Nov. 12, 1998  (JP) .......................................... 10-322454

(51) Int. Cl.[7] ........................................... H01L 23/495
(52) U.S. Cl. ................... 257/672; 257/666; 257/667; 257/670; 438/111; 438/112; 437/206; 437/217
(58) Field of Search .................... 257/666, 667, 257/672, 692, 694, 695, 696, 676, 670; 438/111, 112; 437/206, 217

(56) References Cited

U.S. PATENT DOCUMENTS

| | | | | |
|---|---|---|---|---|
| 5,227,232 A | * | 7/1993 | Lim ............................ | 428/344 |
| 5,233,220 A | | 8/1993 | Lamson et al. ............. | 257/666 |
| 5,293,065 A | * | 3/1994 | Chan ........................... | 257/667 |
| 5,369,545 A | * | 11/1994 | Bhattacharyya et al. . | 361/306.2 |
| 5,684,328 A | * | 11/1997 | Jin et al. ..................... | 257/669 |
| 6,002,166 A | * | 12/1999 | Noda et al. ................. | 257/666 |

FOREIGN PATENT DOCUMENTS

| | | |
|---|---|---|
| JP | 58-51525 | 3/1983 |
| JP | 3-102861 | 4/1991 |
| JP | 05021695 A | * 1/1993 |
| JP | 7-14976 | 1/1995 |

* cited by examiner

Primary Examiner—Eddie Lee
Assistant Examiner—Chris C. Chu
(74) Attorney, Agent, or Firm—Staas & Halsey LLP

(57) ABSTRACT

A lead frame for semiconductor device comprising inner leads, outer leads, and dam bars, the inner leads being divided into two groups which are located in opposed areas of the lead frame divided by the center line of the array of the electrode pads of a semiconductor chip to be mounted on the lead frame, and the inner lead having a first end and a second end, the first ends of the respective inner leads being arranged into arrays along an array of electrode pads of the semiconductor chip, so that the array of the first ends has a pitch corresponding to a pitch in the array of the electrode pads, the second ends of the respective inner leads being arranged into arrays at opposed sides of the lead frame, to have a pitch larger than the pitch in the array of the first ends, wherein at least some of the inner leads are arranged to have lengths between the first and the second ends which are substantially equivalent to each other. A semiconductor device using the lead frame is also disclosed.

6 Claims, 9 Drawing Sheets

LEAD FRAME FOR SEMICONDUCTOR DEVICE AND SEMICONDUCTOR DEVICE USING SAME

BACKGROUND OF THE INVENTION

1. Field of the Invention

The invention relates to a lead frame for a semiconductor device and a semiconductor device using the same.

2. Description of the Related Art

A lead frame is a member used to make a resin encapsulation package, which encapsulates a semiconductor chip and is mounted on a substrate, such as a printed circuit board, to electrically connect the semiconductor chip to the substrate. An example of such a lead frame is shown in FIG. 1, which is applied for manufacture of package for a lead on chip (LOC) type.

A lead frame 100 shown in FIG. 1 comprises, in general, inner leads 104, outer leads 106, and dam bars 108. The inner lead 104 has a first end 104a, which is connected to an electrode pad 102 of a semiconductor chip 101, and a second end 104b, which is connected to the outer lead 106, and is ultimately encapsulated by a resin to form a package 103. The outer lead 106 serves as a terminal for electrically connecting the package 103 to an external circuit. The dam bar 108 connects adjacent outer leads 106 to each other and dams up an encapsulating resin material during the preparation of the package 103, and is cut away prior to practical use of the package 103. Although this drawing shows only a portion of each outer lead 106 near the dam bar 108, the respective outer leads 106, in fact, extend outwardly and have equal lengths. For simplicity, the drawing shows the semiconductor chip 101 and the package 103 by phantom lines, and omits most of inner leads 104 and all of connections between the first ends 104a of the inner lead 104 and the electrode pads 102 of the chip 101.

The electrode pads 102 of the semiconductor chip 101 line up in a long and narrow region A to form an array. The first ends 104a of the inner leads 104 are located along both sides of the region A, at a certain pitch P1, to be connected to the respective electrode pads 102 by, for example, a wire (not shown). Thus, the first ends 104a of the inner leads 104 are arranged in two arrays. These arrays of first ends 104a of the inner leads 104 are in parallel with each other and with the array of the electrode pads 102 of the chip 101. Each inner lead 104 has a second end 104b to be connected to the outer lead 106, and the ends 104b of the respective inner leads 104 are located at opposed sides of the lead frame 100 to form arrays, which are in parallel with each other and with the arrays of the first ends 104a of the inner leads 104 and the electrode pads 102 of the chip 101, and have a certain pitch P2 broader than pitch P1 of the arrays of first ends 104a.

As described above, the first ends 104a of the inner lead 104 are arranged into two arrays B, and the second ends 104b of the inner lead 104 are arranged into two arrays C. These four arrays are in parallel with the longitudinal center line D of the array of the electrode pads 102 of the chip 101, with the two arrays B being symmetrical with regard to the center line D, and the two arrays C also being symmetrical with regard to the center line D. In addition, the respective centers of the four arrays are located on the line E which crosses the center O of the array of the electrode pads 102 and is perpendicular to the center line D of the array of the electrode pads 102. Thus, the arrays B of the first ends 104a are symmetrical with regard to the center O, and the arrays C of the second ends 104b are also symmetrical with regard to the center O.

It is conventional that the intermediate portion connecting the first end 104a to the second-end 104b of each inner lead 104 is formed in a straight line so as to link the electrode pad 102 to the outer lead 106 over the shortest distance. Accordingly, the inner lead 104 adjacent to the line E has a smallest length, the inner lead 104 farthest from the line E has a largest length, and the inner leads 104 between them having a length which is intermediate between both lengths, with the farther, the longer. Thus, the inner leads 104 have uneven lengths.

Recently, as the clock frequency of a central processing unit (CPU) increasingly becomes higher, packages for semiconductor devices used in CPUs and associated large scale integrated circuits (LSIs) are required to cope with such a higher frequency. For this purpose, it is envisaged, for example, (1) to use shorter signal lines for less delay time, (2) to use a transmitting line structure of signal lines having an equivalent characteristic impedance, or (3) to use signal lines of equivalent lengths to eliminate or reduce variation of delay times between the signal lines. As a technique to specifically realize such requirements, reference can be made to use of chip sized package (CSP).

Nevertheless, in the case of CSPs, a package has matrix-like terminals for external connection of, for example, 0.75 millimeter pitch, which raises a problem of a higher cost because of a necessity of substrate allowing a package or packages having terminals in such a higher density to be mounted thereon. In addition, CSPs have not yet demonstrated sufficient reliability for mounting on a substrate.

SUMMARY OF THE INVENTION

The invention relates to semiconductor devices using a lead frame, which have been, unlike CSPs, successfully used, to date, in large quantities. Thus, it is an object of the invention to provide a lead frame enabling a semiconductor chip operating at a higher frequency to be mounted thereon. The invention further provides a semiconductor device using such a lead frame, and a method of producing the lead frame.

In one aspect, the invention provides a lead frame for semiconductor device comprising inner leads for electrical connection with a semiconductor chip, outer leads linked with the respective inner leads and used for electrical connection with a substrate on which the semiconductor device is mounted, and dam bars linking the adjacent outer leads together and preventing an encapsulating material from intruding into between the outer leads during encapsulation of the semiconductor chip together with the lead frame to produce the semiconductor device, the inner leads being divided into two groups which are located in opposed areas of the lead frame divided by the center line of the array of the electrode pads of the semiconductor chip, and the inner lead having a first end and a second end, the first ends of the respective inner leads, for the electrical connection with the semiconductor chip, being arranged into arrays along an array of electrode pads of the semiconductor chip, so that the array of the first ends has a pitch corresponding to a pitch in the array of the electrode pads, the second ends of the respective inner leads for the linkage with the outer leads being arranged into arrays at opposed sides of the lead frame, so as to have a pitch larger than the pitch in the array of the first ends, wherein at least some of the inner leads are arranged so as to have lengths between the first and the second ends which are substantially equivalent to each other.

Preferably, in each of the opposed areas, the centers of the arrays of the first and the second ends of the inner leads are displaced from each other in the direction of the arrays.

Preferably, in each of the opposed areas, the array of the first ends of the inner leads is positioned in one of two sections divided by the line crossing the center of the array of the electrode pads of the chip perpendicularly to the array of the electrode pads, and the array of the second ends of the inner leads is positioned in the other of the two sections.

Preferably, a set of the inner leads in the one of the two areas and a set of the inner leads in the other of the two areas are positioned symmetrically with regard to the center of the array of the electrode pads.

Preferably, said some of the inner leads, arranged so as to have lengths between the first and the second ends which are substantially equivalent to each other are inner leads for signal transmission.

In another aspect, the invention provides a semiconductor device comprising a semiconductor chip, a lead frame, and a package made of a molding material to encapsulate the semiconductor chip together with the lead frame, wherein the lead frame is as delineated above.

In a further aspect, the invention provides a semiconductor device comprising a semiconductor chip, a lead frame, and a package made of a molding material to encapsulate the semiconductor chip together with the lead frame, wherein the lead frame is a composite of two unit lead frames, the unit lead frame being the lead frame, as delineated above, in which, in each of the opposed areas, the array of the first ends of the inner leads is positioned in one of two sections divided by the line crossing the center of the array of the electrode pads of the chip perpendicularly to the array of the electrode pads, and the array of the second ends of the inner leads is positioned in the other of the two sections, the unit lead frames being combined with each other in such a manner that the outer leads of the unit lead frames are arranged into an array at each side of the composite.

BRIEF DESCRIPTION OF THE DRAWINGS

The above and other objects and advantages of the invention will be well understood and appreciated, by a person with ordinary skill in the art, from consideration of the following detailed description made by referring to the attached drawings, wherein.

DETAILED DESCRIPTION OF THE INVENTION

Figure 1:
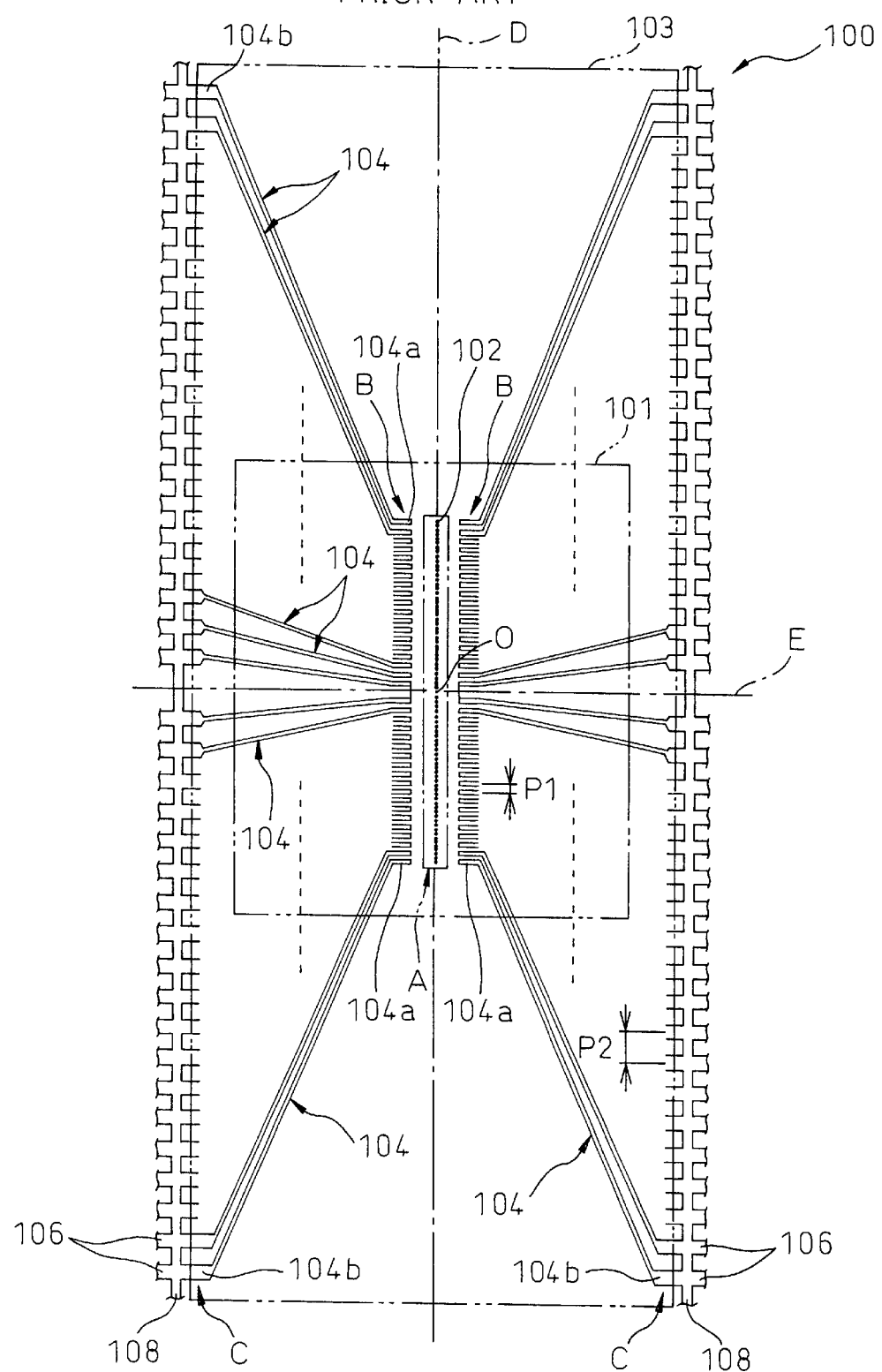
FIG. 1 a schematic plan view of a prior lead frame for semiconductor device.

First, the basic idea of the invention is shown with reference to FIG. 2, which illustrates a lead frame for LOC, and in which the same members as those in the prior lead frame for LOC as earlier described with reference to FIG. 1 are indicated by the same reference numerals as those in FIG. 1, and the details of them are as described hereinabove.

A lead frame 10 for semiconductor device of the invention has inner leads 12 of a construction similar to construction of inner leads in conventional lead frames used in LOCs as earlier described. The inner lead 12 has a first end 12a connected to an electrode pad 102 of a semiconductor chip 101 and a second end 12b connected to an outer lead 106, and is encapsulated by an encapsulating or molding material, such as a resin, to form a package 103. A pair of arrays B of the first ends 12a of the inner leads 12 is located in an inside region, preferably a central region, of the lead frame 10, along a long and narrow region A in which the electrode pads 102 of the semiconductor chip 101 will line up. The arrays B are in parallel with each other. The ends 12a of each array are positioned at a certain pitch. Each of the ends 12a is connected to an electrode pad 102 by, for example, a wire in a conventional manner. Arrays C of the second ends 12b are located in opposed sides of the lead frame 10, the arrays C being in parallel to each other and also in parallel to the arrays B of the first ends 12a. The ends 12b of each array C are also positioned at a certain pitch, which is greater than the pitch of the ends 12a in the arrays B located in the inside region of the lead frame 10. For simplicity, FIG. 2 shows the semiconductor chip 101 and the package 103 by phantom lines, and omits most of the inner leads 12 and outer leads 106 of the lead frame 10 as well as most of the electrode pads 102 of the chip 101. Further, FIG. 2 shows the intermediate portions of the inner leads 12 by solid lines, also for simplicity.

The two arrays B of the inner, first ends 12a of the inner leads 12 are symmetrical with regard to the longitudinal center line D of the array of the electrode pads 102 of the chip 101. Also, the two arrays C of the outer, second ends 12b of the inner leads 12 are symmetrical with regard to the center line D. In addition, the respective centers of the four arrays are located on a line E which crosses the center O of the array of the electrode pads 102 and is perpendicular to the center line D of the array of the electrode pads 102. Thus, the arrays B of the first ends 12a are symmetrical with regard to the center O, and the arrays C of the second ends 12b are also symmetrical with regard to the center O.

Figure 2:
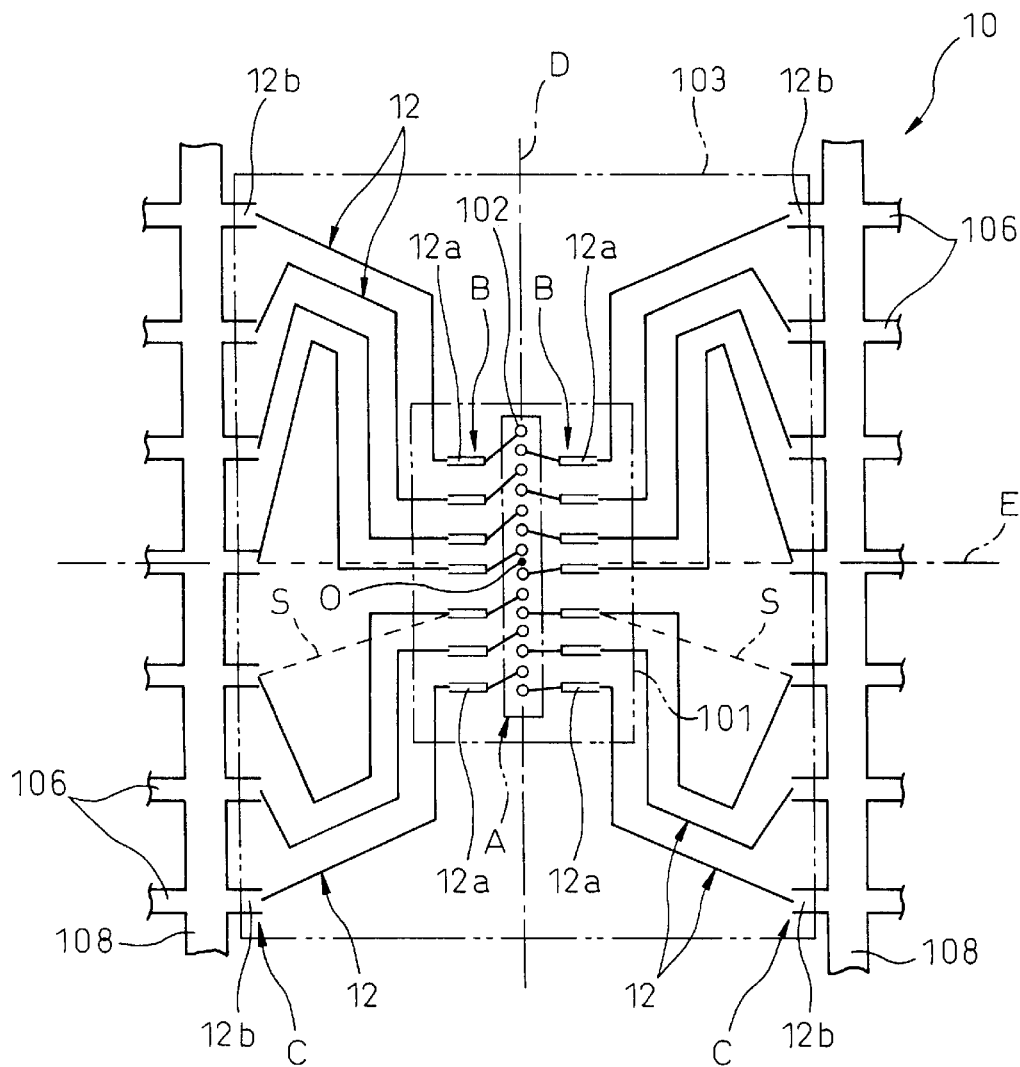
FIG. 2 is a schematic view to illustrate the basic idea of the lead frame for semiconductor device of the invention.

A semiconductor device using the lead frame 10 of FIG. 2 is produced by connecting the electrode pads 102 of the semiconductor chip 101 mounted on the lead frame 10 with the first ends 12a of the inner leads 12 of the lead frame 10 by, for example, a wire to form an assembly, encapsulating the assembly by an encapsulating material such as a resin, and cutting away the dam bars 108 to provide the final package 103.

According to the invention, variations in delay times between separate signal lines of a semiconductor device are restrained or reduced because their lengths are equivalent or substantially equivalent to each other, so that the semiconductor device can cope with the demand for higher frequency.

Figure 3:
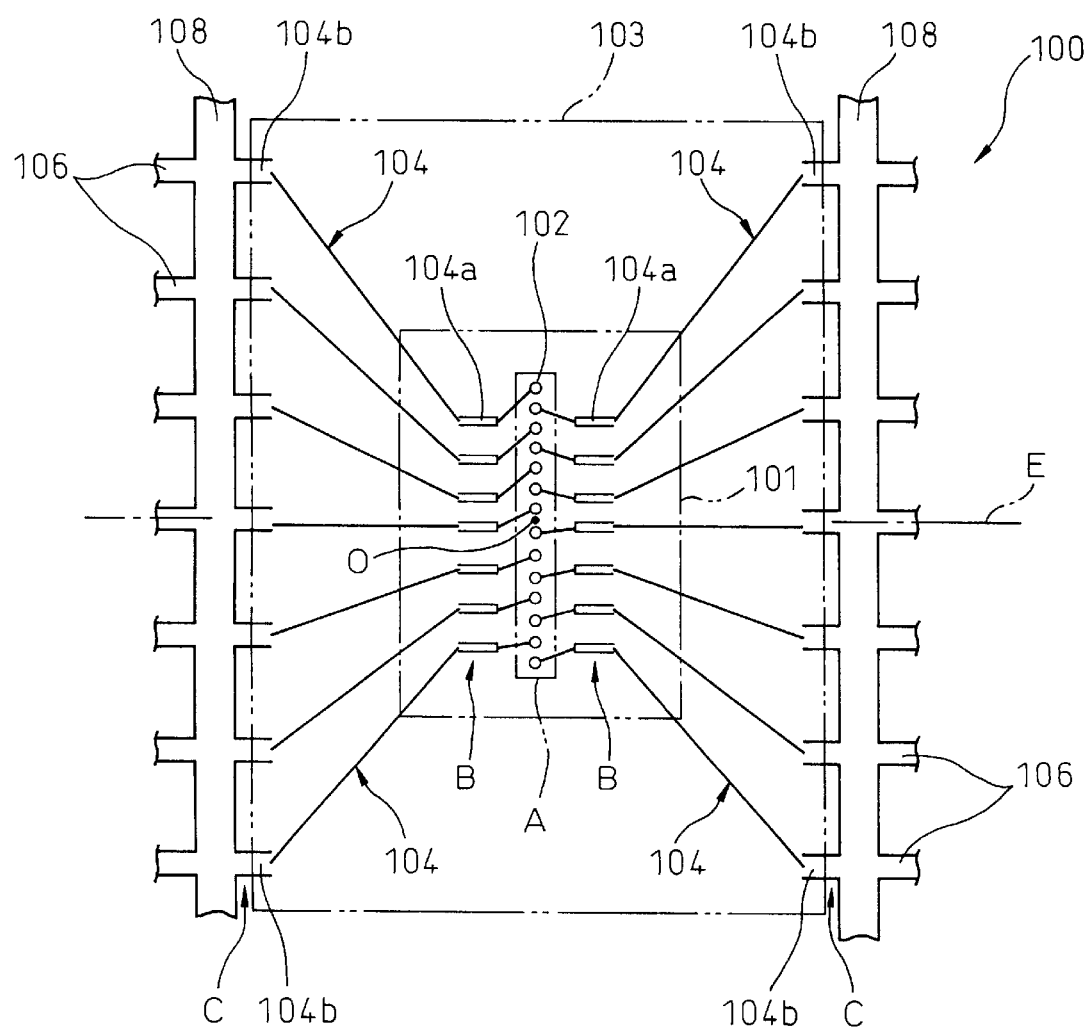
FIG. 3 a schematic view of a prior lead frame depicted in the same manner as FIG. 2.

The lead frame 10 of the invention is contrasted with a prior lead frame 100 shown in FIG. 3, which is a simplification of the prior lead frame shown in FIG. 1. In the invention, at least inner leads for signal lines, among others, are arranged so as to non-straightly extend from a first end 12a to a second end 12b to thereby have lengths between both ends 12a and 12b (i.e., signal transmitting path lengths) which are substantially equivalent to each other. In contrast, the inner leads 104 of the prior lead frame 100 shown in FIG. 3 are formed so as to straightly extend from a first end 104a to a second end 104b to have lengths between both ends 104a and 104b which are different from each other.

The non-straight, twisted inner lead 12 in the invention may be made up of a plurality of straight lines, as schematically shown in FIG. 2, or of a curved line (not shown), or a combination of one or more straight lines and one or more curved lines. If the inner leads are straight as in FIG. 3, since the centers of the two arrays B of the first ends 12a and the two arrays C of the second ends 12b of the inner leads 12 are on the line E crossing the center O of the array of the electrode pads 102, as earlier described, the separate inner leads 12 have lengths different from each other, the inner leads in the vicinity of line E having smaller lengths than those farther from line E. In the lead frame 10 of the invention shown in FIG. 2, for the inner leads 12 to have a substantially equivalent length, a group of the inner leads 12 closer to the lateral center line E is first deviated from the center line E and then returned toward the center line E so that the respective inner leads 12 of this group gain extra lengths. Since a group of the inner leads 12 farther from the center line E have, by nature, greater lengths than those closer to the center line E, the inner leads 12 of this group should not suffer, by the deviation of the group of inner leads closer to the center line E, as large extra lengths as those which the inner leads 12 of the group closer to the center line E gain.

In FIG. 2, all inner leads 12 are non-straightly formed in the same plane to have an equivalent length. With a lead frame having a larger number of inner leads, spaces enabling the inner leads closer to the center line E to be formed to have lengths equivalent to those of the inner leads farther from the center line E cannot be secured at all because of a higher density of inner leads. In such a case, the inner leads 12 closer to the center line E compelled to have a shorter length may be straightly formed, as shown by the broken lines S in FIG. 2 by way of example, and be used as power supply lines, lower frequency signal lines, and/or ground lines rather than higher frequency signal lines.

Figure 4:
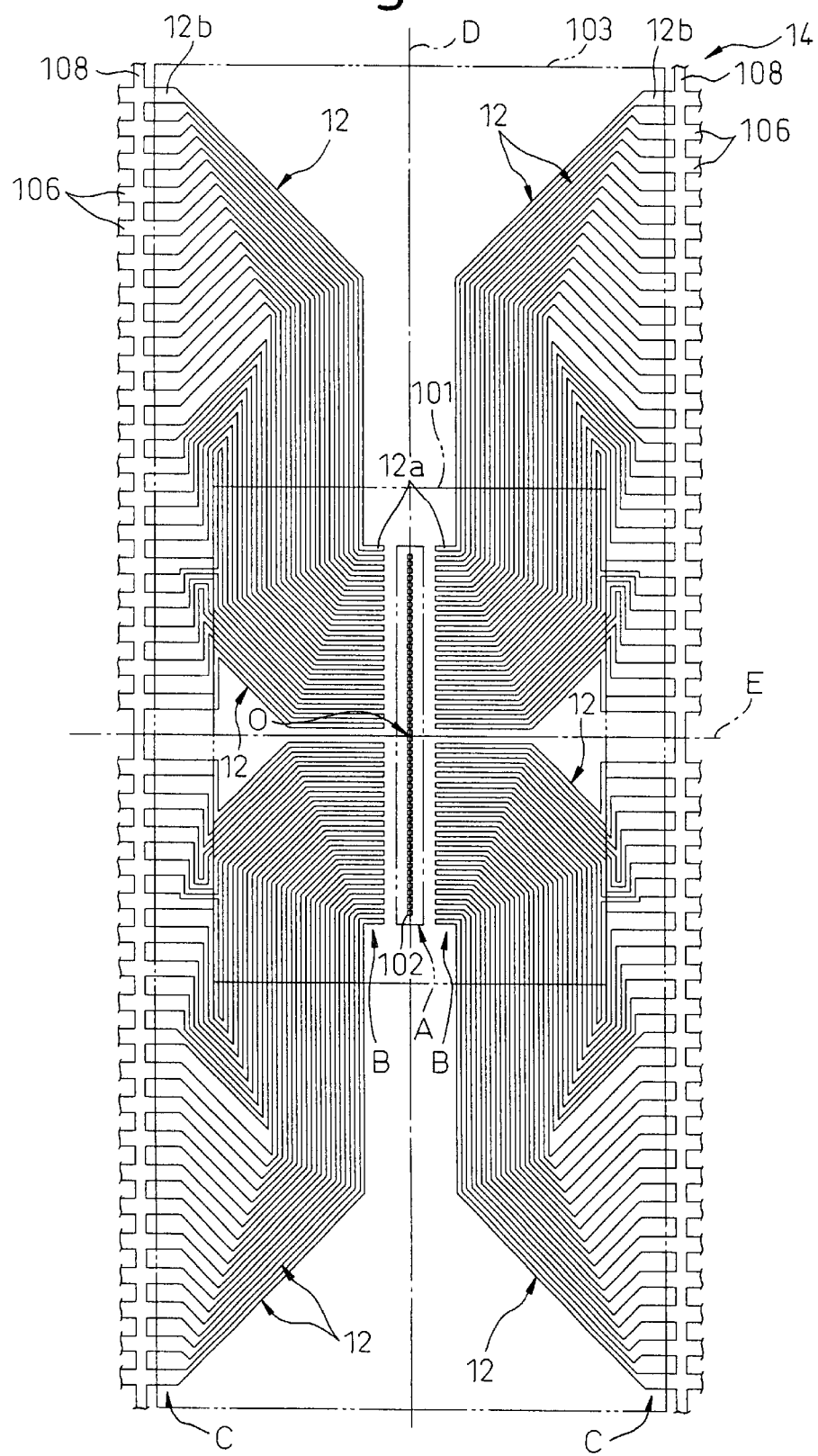
FIG. 4 is a plan view of an embodiment of the lead frame of the invention.

An embodiment of the invention is illustrated in FIG. 4. In this embodiment, the lead frame 14 has a total of 76 inner leads 12 which are respectively connected to outer leads 106, the adjacent outer leads 106 being linked to each other by a dam bar 108. The arrays B of the first ends 12a of the inner leads 12, each of which comprises a half of the ends of 76 inner leads, i.e., 38 first ends 12a, are symmetrical with regard to the center O of the array of the electrode pads 102, and the arrays C of the second ends 12b of the inner leads 12, each of which also comprises 38 second ends 12b, are also symmetrical with regard to the center O, as earlier described. The centers of the four arrays are located on the center line E crossing the center O of the array of the electrode pads 102 perpendicularly to the array of the electrode pads 102. The inner leads 12 are bent or twisted at angles of 45°, 90°, and/or 135°. The semiconductor chip 101 used in this embodiment and shown by a phantom line had a size of 8.1×10.0 millimeters, and the semiconductor device (package) 103 obtained by encapsulating the chip 101 along with the lead frame 14 and also shown by a phantom line had a size of 10.6×27.4 millimeters.

In the embodiment shown in FIG. 4, which has a significantly larger number of inner leads 12, the inner leads closer to the center line E and having relatively smaller linear lengths between the first ends 12a and the second ends 12b are provided with only smaller areas to obtain non-straight, twisted paths having extra lengths. Specifically, 16 inner leads of a total of 76 inner leads, which are closest to the center line E and located symmetrically with regard to the center line E, can gain only a smaller length than that of the remaining inner leads farther from the center line E.

Figure 5:
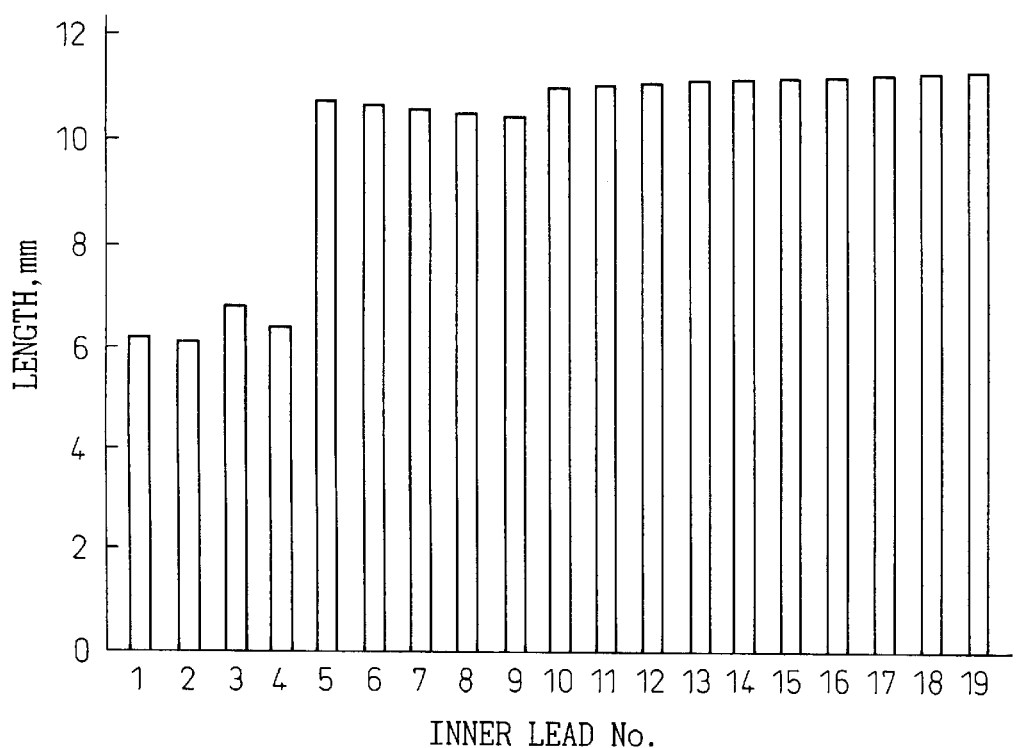
FIG. 5 graphically shows the lengths of the inner leads in one of quarter sections of the lead frame illustrated in FIG. 4.

FIG. 5 shows the lengths of the inner leads 12 in one of the quarter sections of the lead frame 14, i.e., four sections divided by lines D and E in FIG. 4. The quarter section includes 19 inner leads designated by numbers increasing from the inner lead just adjacent to the center line E, the inner lead closest to the center line E having a number of 1, and the inner lead farthest from the center line E having a number of 19. As shown, the four inner leads closest to the center line E have lengths of approximately 6 millimeters, which inner leads are extremely shorter than the other inner leads having substantially equivalent lengths in the range of about 10.5 to 11.4 millimeters.

In this case, the fifteen inner leads 12 outwardly located in each of the four sections can be used for high frequency signal lines, and remaining four inner leads 12 closer to the center line E in each of the four sections can be used for lower frequency signal lines in which delay times are negligible, power supply lines, and/or ground lines. When the number of high frequency signal lines, in which an issue of delay time is concerned, is reversely fewer, the four shorter inner leads in each of the four sections may be formed to have an equivalent length, and used for the high frequency signal lines.

In such an embodiment as shown in FIG. 4, in which the centers of the two arrays B of the first ends 12a of the inner leads 12 and the two arrays C of the second ends 12b are all located on the center line E crossing the center O of the array of the electrode pads 102 perpendicularly to the array of the electrode pads 102, it is not easy to provide inner leads 12 closer to the center line E with lengths equivalent to those of inner leads 12 farther from the center line E, particularly in such a case where the total number of inner leads 12 in the lead frame 14 is relatively large. Nevertheless, it may be required that all inner leads have an equivalent length to each other even though a lead frame has a relatively larger number of inner leads. In such a case, the centers of an array of first ends of inner leads and an array of second ends of the same inner leads may be displaced from each other in the direction of the array of the electrode pads (which is the same as the direction of the arrays of the first and second ends of the inner leads).

Figure 6:
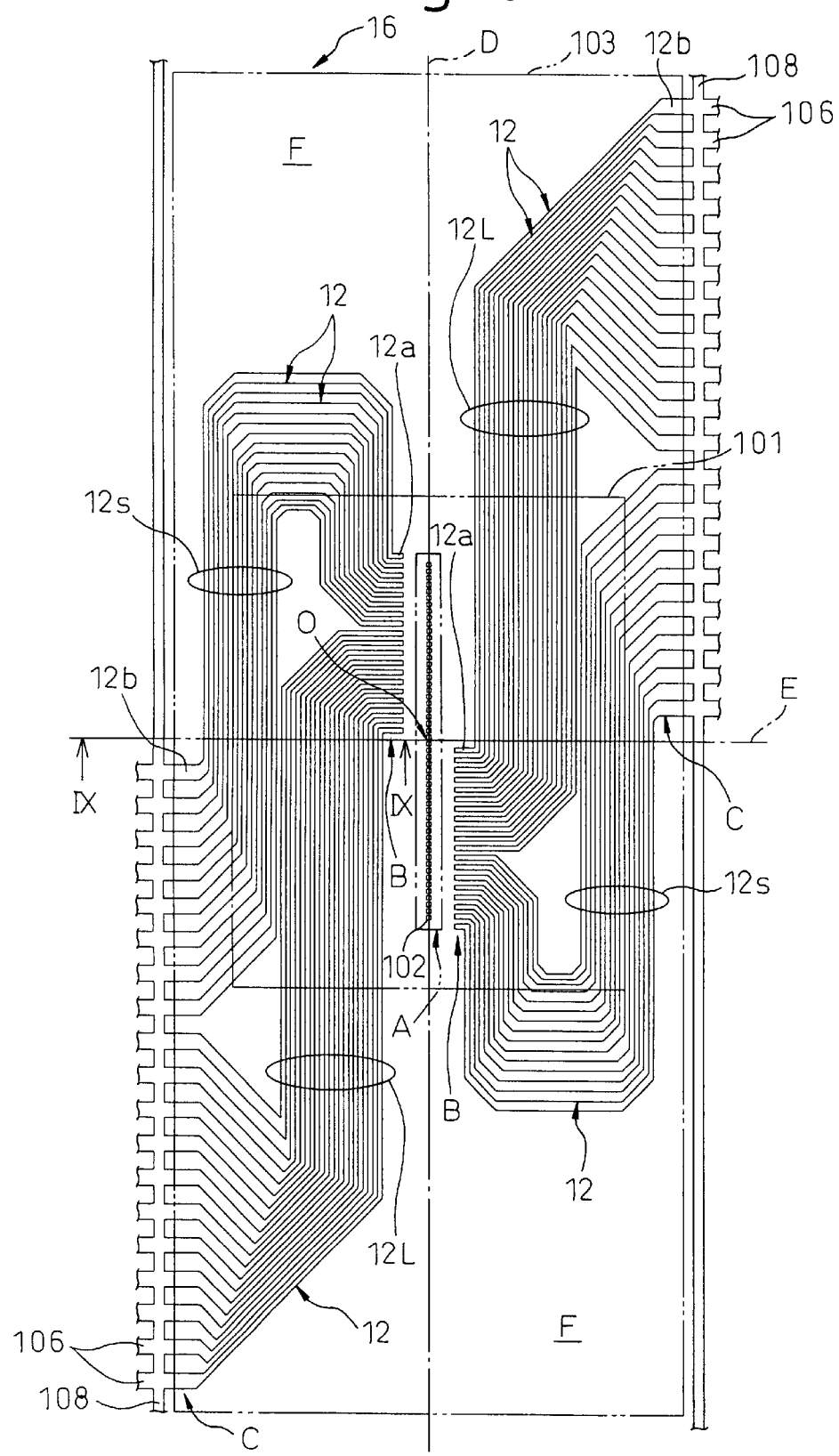
FIG. 6 a plan view of another embodiment of the lead frame of the invention.

For example, as illustrated in FIG. 6 which represents a second embodiment of the invention, the centers of arrays of both ends of inner leads 12 are displaced from each other. In this embodiment, an array B of first ends 12a of half of total inner leads 12 is positioned only in one of two sections divided by the lateral center line E crossing the center O of the array of electrode pads 102 of a chip 102 perpendicularly to the array of electrode pads 102, whereas an array C of second ends 12b of the half of total inner leads 12 is positioned only in the other of the two sections. Thus, in the half area on the left of longitudinal center line D of the array of the electrode pads 102, the array B of the first ends 12a of the inner leads 12 is located above the lateral center line E, the ends 12a in this array being connected to the electrode pads 102 also positioned above the lateral center line E, and the array C of the second ends 12b of the inner leads 12 is located below the lateral center line E. In the other half area on the right of longitudinal center line D, the array B of the first ends 12a of the inner leads 12 is located below the lateral center line E, the ends 12a in this array being connected to the electrode pads 102 also positioned below the lateral center line E, and the array C of the second ends 12b of the inner leads 12 is located above the lateral center line E. The semiconductor chip 101 used in this embodiment and shown by a phantom line had a size of 8.1×10.0 millimeters, and the semiconductor device (package) 103 obtained by encapsulating the chip 101 along with the lead frame 16 of this embodiment and also shown by a phantom line had a size of 10.6×27.4 millimeters.

In the present embodiment, the respective inner leads 12 in each group or set of inner leads 12 located on one side of the longitudinal center line D can have lengths greater than the lengths which the inner leads 12, in the embodiment earlier described referring to FIG. 4, have, in which, unlike the present embodiment, the centers of the arrays of the first ends 12a and the second ends 12b of the inner leads 12 are not displaced from each other in the direction of the arrays. As can be seen from FIG. 6, the top inner lead 12 on the left side of the longitudinal center line D in this embodiment has a smallest linear length (which represents a length between the first ends 12a and the second ends 12b when the inner lead is straightly formed), and the bottom inner lead 12 has a largest linear length, and in this side, the top and neighbor inner leads 12 having smaller linear lengths than those of the lower inner leads 12 can gain additional lengths by being wound or twisted in a large free space designated by F in the drawing, to thereby have lengths equivalent to those of the lower inner leads 12. On the right side of the longitudinal center line D, the top inner lead 12 has a largest linear length, and the bottom inner leads 12 has a smallest linear length, to the contrary, and in this side, the bottom and neighbor inner leads 12 having smaller linear lengths than those of the upper inner leads 12 can also gain additional lengths by being wound or twisted in a large free space also designated by F in the drawing, to have lengths equivalent to those of the upper inner leads 12. It goes without saying that the inner leads on both sides of the longitudinal center line D have substantially equivalent lengths.

More specifically, on the left side of the longitudinal center line D, by way of example, a large free space F appears above the upper inner leads 12 having smaller linear lengths, which form a group designated by 12s, than those of the other lower inner leads 12, which form a group designated by 12L, as a result of the displacement of the array of the first ends 12a and the array of the second ends 12b of the inner leads 12 from each other. The space F enables each of the upper inner leads 12 to be wound or twisted to gain an additional length sufficient to have a total length equivalent to a total length of the lower inner lead 12. The lower inner leads 12 are also wound or twisted to gain lengths equivalent to each other as well as those of the upper inner leads 12, the windings or twists of the lower inner leads 12 being less than those of the upper inner leads 12.

Figure 7:
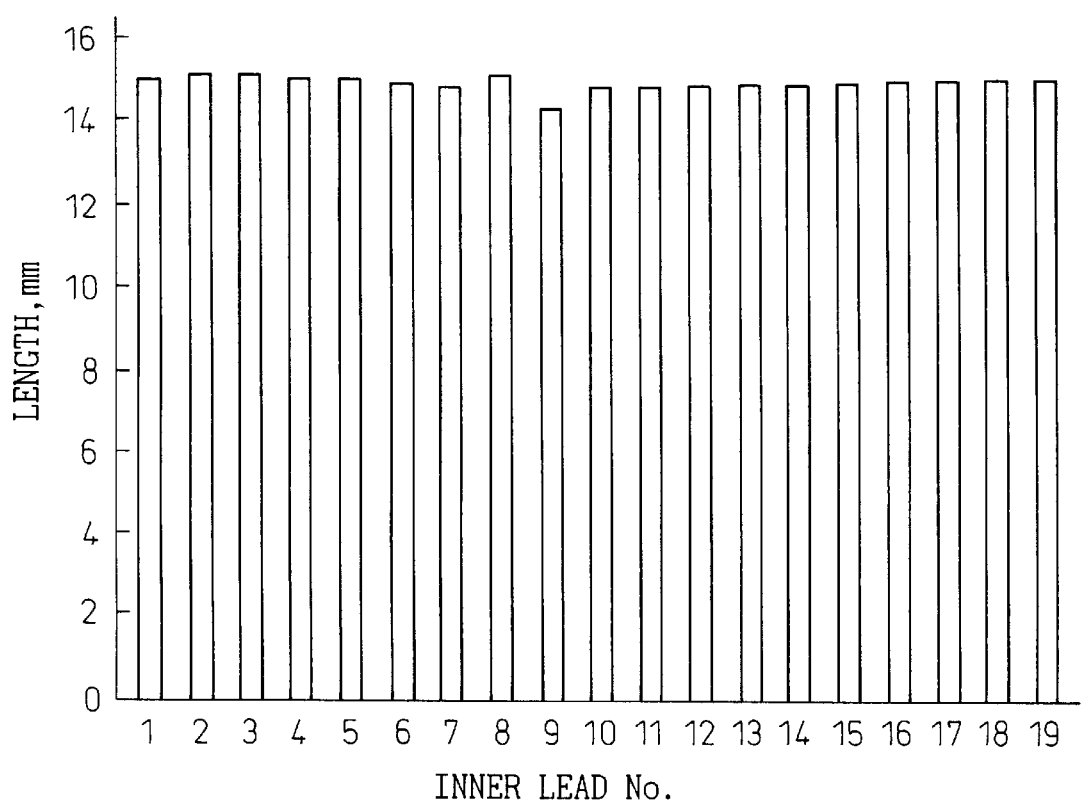
FIG. 7 graphically shows the lengths of the inner leads in one of half areas of the lead frame illustrated in FIG. 6.

FIG. 7 shows the lengths of the inner leads 12 in one of the half areas divided by the longitudinal center line D in FIG. 6. The half area includes 19 inner leads designated by numbers increasing from the inner lead whose end 12a is connected to the electrode pad 102 just adjacent to the center line E. As shown, all inner leads 12 have substantially equivalent lengths of approximately 15 millimeters. It goes without saying that, even for the present embodiment, inner leads 12 for signal lines in which delay times are negligible, power supply lines, and/or ground lines may have non-uniform lengths.

When the lead frame 16 shown in FIG. 6 is solely used, the obtained package 103 has two groups of outer leads 106 which are not symmetrical with regard to the longitudinal and lateral center lines D and E, but are symmetrical with regard to the center O of the array of the electrode pads 102 (which can also represent the center of the package 102), as seen in FIG. 6. In a case where a package is required to have two groups of outer leads located in opposed peripheral sides of the package, symmetrically with regard to a center line of the package, as is the case with ordinary packages, this is accomplished by use of two lead frames 16 as illustrated in FIG. 6, which represents another embodiment of the invention.

Figure 8:
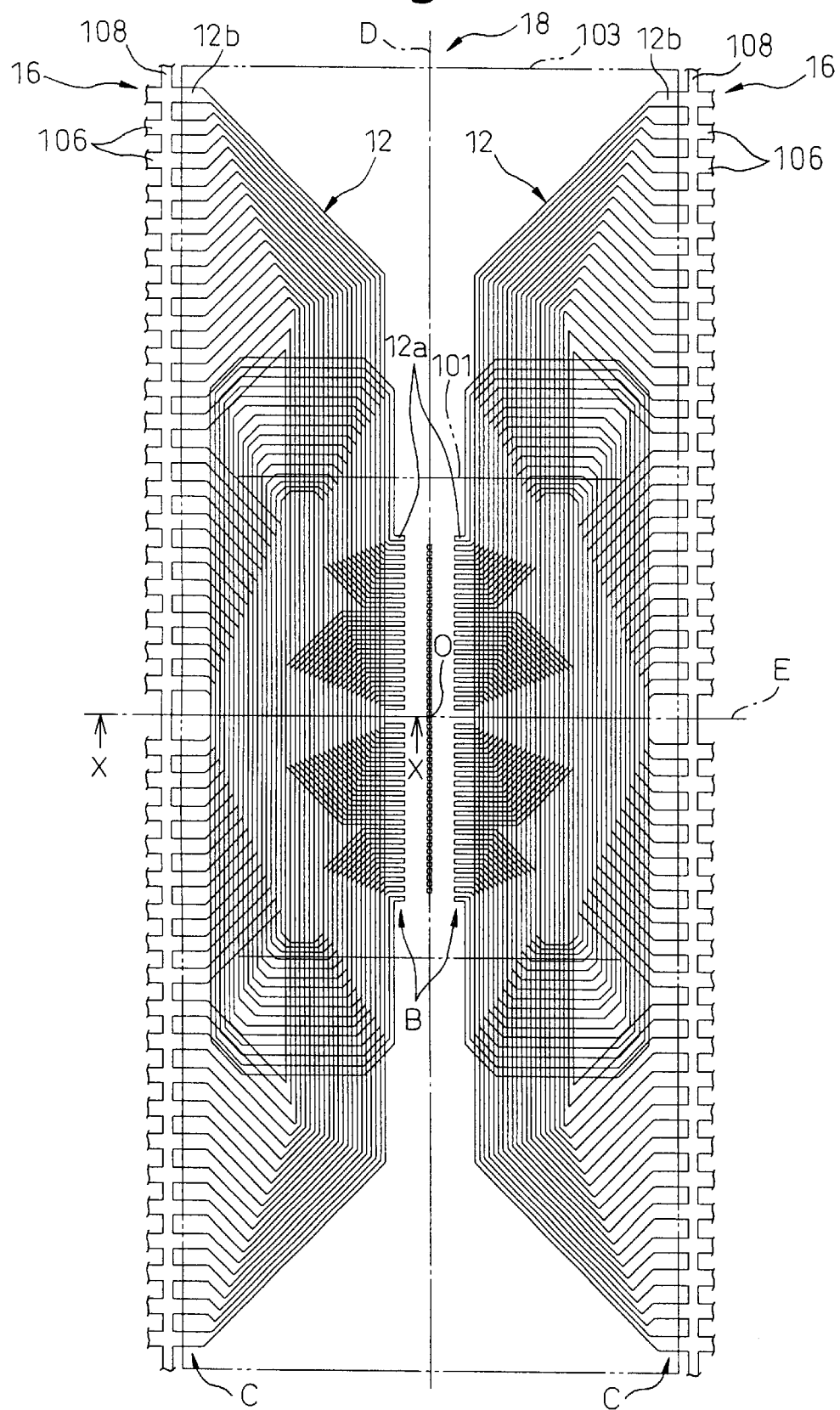
FIG. 8 is a plan view of a further embodiment of the lead frame of the invention.

Specifically, using two lead frames as illustrated in FIG. 6 as unit lead frames, one of the two lead frames 16 is turned over, and the turned-over lead frame is placed on the other lead frame in such a manner that longitudinal and lateral center lines D and E of the respective lead frames agree with each other, as shown in FIG. 8. In the resultant composite lead frame 18 made up of two unit lead frames 16, opposed sides have an array of outer leads 106 spreading over the side, and the arrays of the respective sides are symmetrical with regard to the longitudinal center line D as well as the lateral center line E. An adhesive film (not shown), such as a film of polyimide, can be interposed, as an insulation layer, between the two lead frames 16.

Using this composite lead frame 18, a semiconductor device (package) 103 which has arrays of outer leads 106 located on opposed sides, symmetrically with regard to the center line D as well as the lateral center line E, can be obtained.

Referring to FIG. 6 again, for one of the two areas divided by the longitudinal center line D, by way of example, the array B of the first ends 12a connected to the electrode pads 102 is displaced to one of the two sections divided by the lateral center line E, and the array C of the second ends 12b is displaced to the other section. In some cases, particularly in the case where the lead frame 16 is not used for the composite lead frame 18 as referred to above, the array C of the second ends 12b may be less displaced, to thereby cross the lateral center line E, so that one part of the array C is located below the lateral center line E, and another part of the array C is located above the lateral center line E. Nevertheless, since the array B must be positioned at a location corresponding to a location of the array of the electrode pads 102 to which the ends 12a of the array B are connected, this array B cannot be largely displaced from the location shown in the drawing.

The inner leads in the lead frame of the invention have larger lengths than those in prior lead frames in which inner leads are formed to straightly extend from one ends to the other ends. Consequently, the inner leads in the lead frame of the invention tend to be placed in a manner that adjacent inner leads run in parallel with each other for a longer distance. In such a case, if the adjacent inner leads are for signal transmission, the signals in the respective inner leads interfere with each other.

Figure 9:
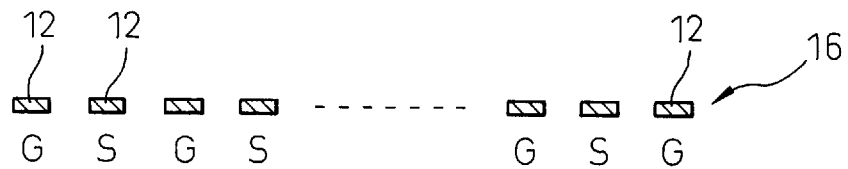
FIG. 9 is a sectional view taken along line IX—IX in FIG. 6.

To solve this problem, it is useful to interpose an inner lead for grounding between inner leads for signal transmission. By way of example, referring to FIG. 9, which shows the section taken along line IX—IX in FIG. 6, inner leads of ground potential, designated by G, are interposed between alternate inner leads for signal transmission, designated by S, to thereby reduce interference between the signals in signal transmitting inner leads.

In the case where a composite lead frame as shown in FIG. 8 is used, there are portions in which inner leads of one lead frame and inner leads of the other lead frame are in the vicinity of each other and run in parallel. In such a portion, as shown in FIG. 10, which represents the section taken along line X—X in FIG. 8, it is preferred that inner leads of ground potential, designated by G, are interposed between alternate inner leads for signal transmission, designated by S, in each of the two lead frames 16, and in addition, the signal transmitting inner leads S and the grounding inner leads G of one of the two lead frames are opposed to the grounding inner leads G and the signal transmitting inner leads S of the other lead frame, respectively, to thereby also reduce interference between the signals in the signal transmitting inner leads of the laminated unit lead frames 16.

Figure 10:
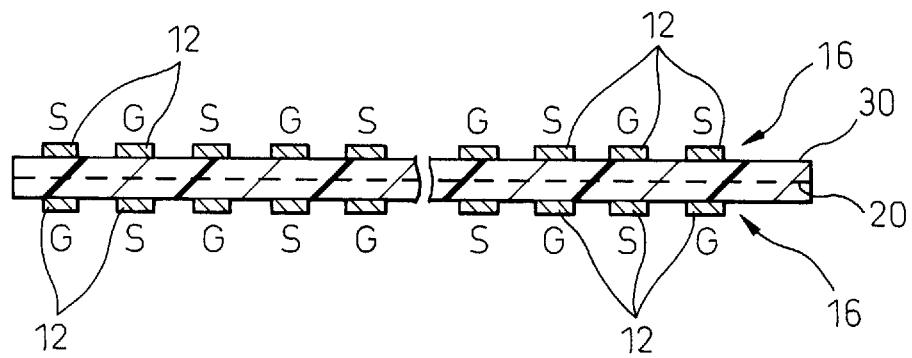
FIG. 10 is sectional view taken along line X—X in FIG. 8.

Also, in the case of use of a composite lead frame as shown in FIG. 8, a metal layer indicated by the broken line 20 in FIG. 10 may be present in an insulation layer 30 interposed between the laminated unit lead frames 16. This metal layer can more effectively prevent the interference between the signals in the signal transmitting inner leads of the laminated unit lead frames 16.

Figure 11:
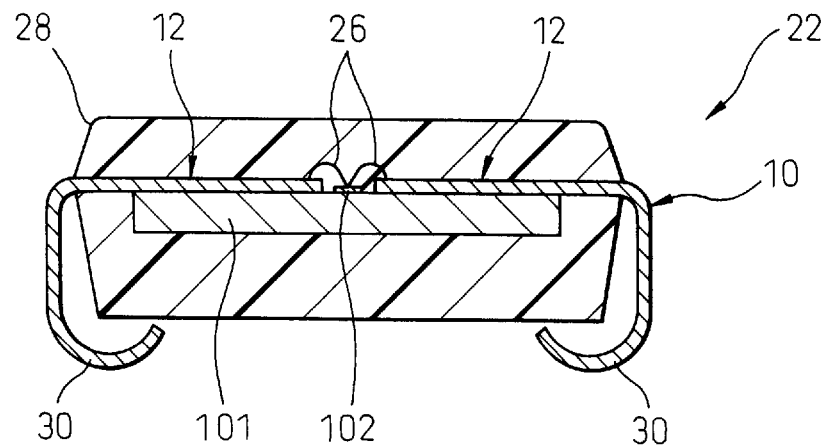
FIG. 11 illustrates a semiconductor device of the invention.

FIG. 11 shows a semiconductor device 22 of the invention, which can use the lead frame of the invention as illustrated in any of FIGS. 4, 6, and 8. The semiconductor device 22 comprises a semiconductor chip 101, a lead frame 10, as generically illustrated in FIG. 2, and a package 28 made of a molding material to encapsulate the semiconductor chip 101 together with the lead frame 10.

The semiconductor device 22 may be produced as follows. The semiconductor chip 101 is mounted on the lead frame 10 using an insulation layer (not shown) which is a film of polyimide or the like to adhesively bond the chip 101 to the lead frame 10, in such a manner that electrode pads 102 lined up in the central region of the chip 101 are positioned between the arrays of ends (first ends) 12a of the lead frame 10 for electrical connection with the pads 102. The ends 12a of the lead frame 10 and the electrode pads 102 of the chip 101 are then electrically connected by a bonding wire 26. Subsequently, the assembly of the semiconductor chip 101 and the lead frame 10 is encapsulated by a molding material to form the package 28. After the encapsulation, dam bars 108 (FIG. 2) of the lead frame 10 are cut away, and outer leads 106 (FIG. 2) are then worked into externally connecting terminals 30, as is well known to a person with ordinary skill in the art.

According to the invention, the lead frame can have inner leads having substantially equivalent lengths of signal transmitting path. Using this lead frame, unevenness of delay times of signals transmitted through the respective inner leads is negligible, for example, even when a plurality of high frequency signals are simultaneously input from external circuits.

It will be appreciated by a person with ordinary skill in the art that the invention is not limited to the preferred embodiments as described above, and various changes or modifications may be made thereto without departing from the spirit and the scope of the invention set forth herein as well as the appended claims. For example, it would be apparent that symmetry of two groups of inner leads in a lead frame is not always required provided that the inner leads can have an equivalent or substantially equivalent length.

What is claimed is:

1. A lead frame for semiconductor device to electrically connect with a semiconductor chip, outer leads linked with inner leads and used for electrical connection with a substrate on which the semiconductor device is mounted, and dam bars linking adjacent outer leads together and preventing an encapsulating material from intruding between the outer leads during encapsulation of the semiconductor chip together with the lead frame to produce the semiconductor device, the inner leads being divided into two groups which are located in two opposed areas on opposite sides of a center line of the lead frame, and the inner leads each having a first end and a second end, the first ends for electrical connection with the semiconductor chip being arranged into first and second first end arrays, respectively located in the two opposed areas along first and second arrays of electrode pads, so that the first end arrays have a pitch corresponding to a pitch of the electrode pads, the second ends being arranged into first and second end arrays, respectively located in the two opposed areas, the second end arrays having a pitch larger than the pitch of the first end arrays, wherein at least two of the inner leads are arranged to have lengths between the first and the second ends which are equivalent to each other, wherein a center of the first first end array is displaced along a longitudinal direction relative to a center of the second first end array, and a center of the first second end array is displaced along the longitudinal direction relative to a center of the second second end array.

2. The lead frame for semiconductor device of claim 1, wherein a set of the inner leads in the one of the two areas and a set of the inner leads in the other of the two areas are positioned symmetrically with regard to the center of the array of the electrode pads.

3. A semiconductor device comprising a semiconductor chip, a lead frame, and a package made of a molding material to encapsulate the semiconductor chip together with the lead frame, wherein the lead frame is a lead frame as claimed in claim 2.

4. The lead frame for semiconductor device of claim 1, wherein said some of the inner leads arranged so as to have lengths between the first and the second ends which are equivalent to each other are inner leads for signal transmission.

5. A semiconductor device comprising a semiconductor chip, a lead frame, and a package made of a molding material to encapsulate the semiconductor chip together with the lead frame, wherein the lead frame is a lead frame as claimed in claim 4.

6. A semiconductor device comprising a semiconductor chip, a lead frame, and a package made of a molding material to encapsulate the semiconductor chip together with the lead frame, wherein the lead frame is a lead-frame as claimed in claim 1.

* * * * *